(12) United States Patent
Høyerby et al.

(10) Patent No.: US 10,854,500 B2
(45) Date of Patent: *Dec. 1, 2020

(54) GATE DRIVER CIRCUITRY FOR POWER TRANSISTORS

(71) Applicant: Infineon Technologies Austria AG, Villach (AT)

(72) Inventors: Mikkel Høyerby, Copenhagen SV (DK); Allan Nogueras Nielsen, Kgs. Lyngby (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/672,038

(22) Filed: Nov. 1, 2019

(65) Prior Publication Data

US 2020/0135536 A1    Apr. 30, 2020

Related U.S. Application Data

(63) Continuation of application No. 15/532,025, filed as application No. PCT/EP2015/077677 on Nov. 25, 2015, now Pat. No. 10,504,769.

(30) Foreign Application Priority Data

Dec. 9, 2014    (EP) .................................... 14197057

(51) Int. Cl.
   *H02M 1/08*    (2006.01)
   *H01L 21/761*    (2006.01)
   (Continued)

(52) U.S. Cl.
   CPC .... *H01L 21/761* (2013.01); *H01L 21/823892* (2013.01); *H01L 27/092* (2013.01);
   (Continued)

(58) Field of Classification Search
   CPC ................. H03K 17/06; H03K 17/687; H03K 2217/0063; H03K 2217/0081; H02M 1/08;
   (Continued)

(56) References Cited

U.S. PATENT DOCUMENTS 9,712,058 B1    7/2017 Newlin
10,504,769 B2 * 12/2019 Hoyerby ......... H01L 21/823892
(Continued)

FOREIGN PATENT DOCUMENTS

CN    1656673 A    8/2005
CN    1674421 A    9/2005
(Continued)

*Primary Examiner* — Adolf D Berhane
(74) *Attorney, Agent, or Firm* — Murphy, Bilak & Homiller, PLLC

(57) ABSTRACT

A regulated high side gate driver circuit for power transistors includes: a gate driver having a high side positive supply voltage port and a high side negative supply voltage port, and a floating voltage regulator. The floating voltage regulator includes: a positive regulator input, connectable to a high side DC voltage supply; a regulated DC voltage output; a negative regulator input; a DC reference voltage generator configured to generate a DC reference voltage; and a regulation capacitor connected between positive and negative terminals of the DC reference voltage generator, and configured to suppress noise and ripple within the generated DC reference voltage. The negative regulator input is connected to the high side negative supply voltage port and the regulated DC voltage output is connected to the high side positive supply voltage port of the gate driver.

21 Claims, 7 Drawing Sheets

(51) Int. Cl.
  *H01L 21/8238* (2006.01)
  *H01L 27/092* (2006.01)
  *H03F 3/217* (2006.01)

(52) U.S. Cl.
  CPC .......... *H02M 1/08* (2013.01); *H03F 3/2173* (2013.01); *H03K 2217/0063* (2013.01); *H03K 2217/0081* (2013.01)

(58) Field of Classification Search
  CPC ......... H03F 3/217; H03F 3/2217; H03L 5/00; H01L 21/761; H01L 21/823892; H01L 27/092
  See application file for complete search history.

(56) References Cited

U.S. PATENT DOCUMENTS

| | | |
|---|---|---|
| 2007/0069700 A1 | 3/2007 | Moraveji et al. |
| 2008/0252372 A1 | 10/2008 | Williams |
| 2011/0298497 A1 | 12/2011 | Nishijima et al. |
| 2012/0091976 A1 | 4/2012 | Chen et al. |
| 2013/0099846 A1 | 4/2013 | Sohma |
| 2016/0322902 A1 | 11/2016 | Tsuruyama et al. |
| 2016/0336442 A1 | 11/2016 | Nielsen et al. |
| 2018/0337599 A1 | 11/2018 | Chen et al. |

FOREIGN PATENT DOCUMENTS

| | | |
|---|---|---|
| CN | 1849740 A | 10/2006 |
| CN | 102577062 A | 7/2012 |
| CN | 103620954 A | 3/2014 |
| JP | H11225470 A | 8/1999 |
| JP | 2003264435 A | 9/2003 |
| JP | 2010226334 A | 10/2010 |
| JP | 2012019625 A | 1/2012 |
| JP | 2012151838 A | 8/2012 |
| JP | 2014522612 A | 9/2014 |
| WO | 2012005341 A1 | 1/2012 |
| WO | 2012171938 A2 | 12/2012 |
| WO | 2015110362 A1 | 7/2015 |

* cited by examiner

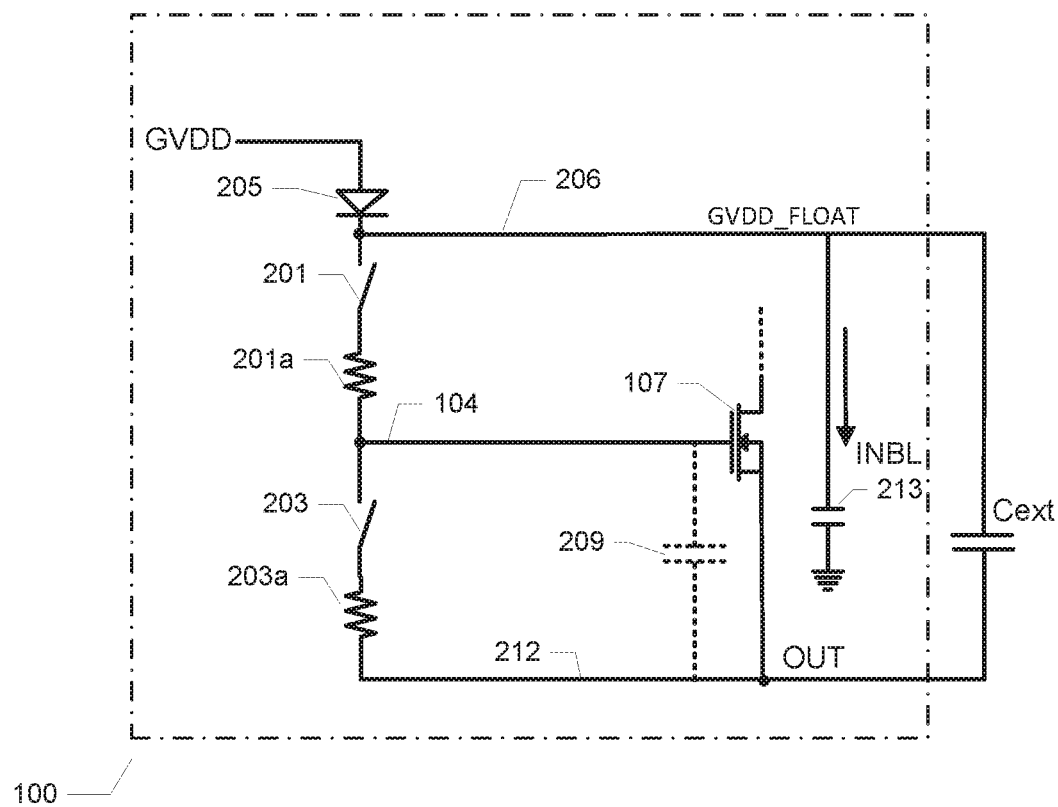
FIG. 2A) (PRIOR ART)
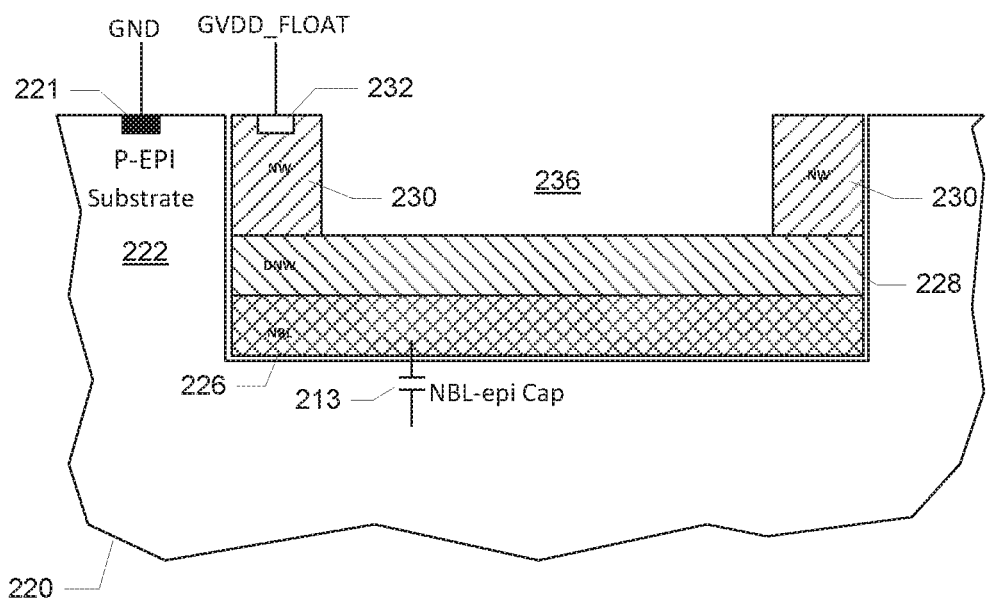
FIG. 2B) (PRIOR ART)

GATE DRIVER CIRCUITRY FOR POWER TRANSISTORS

The present invention relates in a first aspect to a regulated high side gate driver circuit for power transistors. The regulated high side gate driver circuit comprises a gate driver powered by a floating voltage regulator which comprises a linear regulating device.

BACKGROUND OF THE INVENTION

Integrated class D audio amplifiers have been around for more than 10 years and steadily gained popularity due to numerous advantageous characteristics such as high power conversion efficiency, small dimensions, low heat generation and good sound quality. Bipolar CMOS and DMOS high voltage semiconductor processes are typical candidates for implementation of these integrated class D audio amplifiers which feature large LDMOS output devices as active switches of output stages. These LDMOS transistors are isolated high side devices and typically NMOS devices to minimize transistor dimensions for a given output resistance of the output stage. As the bipolar CMOS and DMOS high voltage semiconductor processes continue to evolve to feature sizes at 180 nm and below, the gate drive voltage required to the LDMOS active switches is approaching a voltage level around 5 V. This gate drive voltage should not be exceeded by the high side gate driver to maintain gate integrity by limiting the gate-source voltage of the high side LDMOS transistor to a voltage range that fits an oxide voltage range of the LDMOS transistor in question, such as the above-mentioned maximum of 5 V. This drive voltage accuracy requirement or constraint complicates the design of an adequate DC power supply voltage, i.e. the high side positive supply voltage, to the high side gate driver. Traditionally, the accuracy and stability requirements of the gate-source voltage applied to the high side LDMOS transistor have been accomplished by using an external bootstrap capacitor for the DC supply voltage of the high gate driver of every high side LDMOS transistor.

However, external capacitors typically add an unacceptable amount of component and assembly costs for numerous types of applications of the integrated class D audio amplifier, in particular low-cost high-volume consumer audio systems. A further drawback of this solution is that a typical Class D audio amplifier may include numerous high side power transistors and associated high side gate driver circuits each needing an external capacitor. This is for example the situation for H-bridge configured output stages of multi-level PWM amplifiers. Consequently, it is highly desirable to provide a novel high side gate driver and circuit capable of accurately driving a high side LDMOS transistor, and other types of high side power transistors, without any need for an external capacitor to stabilize the high side positive supply voltage for the high side gate driver. This has been accomplished by the present regulated high side gate driver circuit which comprises a novel type of a floating voltage regulator design providing an accurate and stable regulated supply voltage to the gate driver.

SUMMARY OF THE INVENTION

A first aspect of invention relates to a regulated high side gate driver circuit for power transistors. The regulated high side gate driver circuit comprising a gate driver comprising a high side positive supply voltage port, a high side negative supply voltage port, a driver input and a driver output. The regulated high side gate driver circuit further comprises a floating voltage regulator comprising:

a positive regulator input, connectable to a high side DC voltage supply,
a regulated DC voltage output,
a negative regulator input,
a linear regulating device connected to the regulated DC voltage output and configured for suppressing noise and ripple voltage on the high side DC voltage supply in the regulated DC voltage output,
a DC reference voltage generator configured to generate a DC reference voltage at a control terminal of the linear regulating device to set a DC voltage level at the regulated DC voltage output. The floating voltage regulator comprises a regulation capacitor connected between positive and negative terminals of the DC reference voltage generator. The negative regulator input is connected to the high side negative supply voltage port and the regulated DC voltage output is connected to the high side positive supply voltage port of the gate driver.

The floating voltage regulator is connected to the high side positive and negative supply voltage ports of the gate driver and therefore able to maintain an accurate supply voltage level to the gate driver despite voltage fluctuations and voltage spikes on the high side DC voltage supply. Hence, by making an appropriate selection or setting of the DC voltage of the regulated DC voltage output, the voltage swing delivered at the driver output of the gate driver may be limited or restricted to a voltage range that fits the previously discussed oxide voltage range of the power transistor connected to the driver output of the gate driver. Since the DC voltage of the regulated DC voltage output preferably is substantially constant, referred to the negative regulator input, It may be secured that the drive voltage of the gate driver never exceeds the maximum safe gate voltage of the power transistor coupled to the driver output of the gate driver. The DC voltage of the regulated DC voltage output may be set by a suitable programming, adjustment or design of the DC reference voltage generator. The skilled person will understand that the DC voltage of the regulated DC voltage output preferably is substantially constant referred to the negative regulator input.

The linear regulating device may comprise a transistor arrangement comprising one or more transistors such as MOS or LDMOS transistors. The term linear means in the present context that the regulating device is non-switched and the voltage drop across the regulating device produces the predetermined regulated DC voltage. The gate driver may comprise an inverter topology transistor driver. The inverter topology transistor driver may comprise first and second cascaded transistors between the high side positive and negative supply voltage ports of the gate driver. Respective drain or emitter terminals of the series connected first and second transistors are connected to the driver output. The control terminals of the first and second transistors are preferably interconnected to form a common control terminal of the transistor driver.

The connection of the regulation capacitor between the positive and negative terminals of the DC reference voltage generator reduces the capacitance requirement to a sufficiently small value to allow integration of the regulation capacitor on a semiconductor substrate without incurring unacceptable die area consumption. The capacitance of the regulation capacitor may for example be smaller than 200 pF, or more preferably smaller than 100 pF. In a preferred embodiment, the regulation capacitor comprises a metal-insulator-metal (MIM) capacitor with the advantages discussed in further detail below. The MIM capacitor may have a capacitance between 1 pF and 100 pF such as between 10 pF and 50 pF.

According one embodiment of the present regulated high side gate driver circuit, the floating voltage regulator comprises an open-loop topology or feed-forward topology. These embodiments accordingly lack a voltage or current regulation feedback loop extending from the regulated DC voltage output back to the control terminal of the linear regulating device. The open-loop or feed-forward topology of the floating voltage regulator provides a fast response time to the regularly encountered extremely rapid load changes at the regulated DC voltage output. The open-loop or feed-forward topology therefore enables accurate load regulation at the regulated DC voltage output even under challenging load variations as discussed in further detail below in connection with the appended drawings.

The linear regulating may device comprise a pass transistor connected between the positive regulator input and the regulated DC voltage output, wherein a control terminal of the pass transistor is connected to the DC reference voltage generated by the DC reference voltage generator. The pass transistor may comprises MOSFET or bipolar transistor with a source or emitter, respectively, connected to the regulated DC voltage output, and a drain or collector terminal, respectively, connected to the positive regulator input.

In another embodiment of the regulated high side gate driver circuit, the linear regulating device comprises a class AB output stage having a positive power supply terminal connected to the positive regulator input and a negative power supply terminal connected to the negative regulator input. A control terminal of the class AB output stage is furthermore connected to the DC reference voltage and an output of the class AB output stage is coupled to the regulated DC voltage output to source current out, or sink current from, the load at the regulated DC voltage output. The class AB output stage is capable of both sourcing current out of, and sinking current into, the regulated DC voltage output. This feature may lead to a more effective suppression of high-frequency ac ripple or noise voltages appearing on the regulated DC voltage output.

One embodiment of the class AB output stage may comprise a first output transistor connected between the positive regulator input and the regulated DC voltage output, a second output transistor connected between the negative regulator input and the regulated DC voltage output; and a bias voltage circuit connected between respective control terminals of the first and second output transistors to set a predetermined DC bias current therein.

One embodiment of the DC reference voltage generator comprises a reversely biased Zener diode, i.e. a Zener diode biased in reverse breakdown mode. The Zener diode is preferably connected between the DC reference voltage and the negative regulator input. A constant current generator may be configured apply a predetermined DC bias current to a cathode of the Zener diode to develop a suitable, and relatively stable, DC voltage drop across the Zener diode.

An alternative embodiment of the DC reference voltage generator comprises a shunt regulator circuit. The shunt regulator circuit may comprise a shunt transistor connected between the DC reference voltage and the negative regulator input and an error amplifier where the latter comprises an output, a first input and a second input. The output of the error amplifier is connected to a control terminal of the shunt transistor. The shunt regulator circuit further comprises a voltage divider connected to the DC reference voltage and configured to supply a shunt voltage proportional to the DC reference voltage to the first input of the error amplifier. A second DC voltage reference connected to the second input of the error amplifier.

The shunt transistor may comprise a drain extended NMOS (DE-NMOS) transistor in which a first drain terminal of the drain extended NMOS transistor is connected to the DC reference voltage and a second, or extended, drain terminal is connected to the regulated DC voltage output.

The floating voltage regulator may be configured to provide a DC voltage level at the regulated DC voltage output which is at least 5 V higher than a DC voltage supply of the power transistor coupled to the gate driver of the regulated high side gate driver circuit. The power transistor may form part of a class D audio amplifier output stage which comprises a plurality of stacked power transistors as discussed below in further detail. The overdrive capability of at least 5 V of the gate driver ensures an NMOS power transistor of the output stage can be driven into an appropriate low impedance on-state. A DC voltage of the high side DC voltage supply of the regulated high side gate driver circuit may be at least 2 V higher than the DC voltage level of the regulated DC voltage output to ensure that the linear regulating device, e.g. a pass-transistor, of the floating voltage regulator is adequately biased. The pass transistor may comprise a LDNMOS or LDPMOS transistor having drain-source terminals coupled between the positive voltage input of the regulator and the regulated DC voltage output. The high side DC voltage supply is preferably a substantially fixed DC supply voltage which preferably is referred to a ground node or ground potential of a circuit, such as the above-discussed class D audio amplifier output stage, into which the regulated high side gate driver circuit is integrated.

The gate driver of present regulated high side gate driver circuit may be arranged inside a novel type of double junction isolated well structure. This arrangement of the gate driver is further described in the applicant's co-pending European Patent Application No. 14151919.9. This embodiment of the regulated high side gate driver circuit preferably comprises:

a semiconductor substrate comprising a first polarity semiconductor material in which a first well diffusion is formed. The first well diffusion comprising a second polarity semiconductor material and having a peripheral outer wall abutted to the semiconductor substrate. The semiconductor substrate further comprises a second well diffusion comprising first polarity semiconductor material arranged inside the first well diffusion such that an outer peripheral wall of the second well diffusion is abutted to an inner peripheral wall of the first well diffusion. The gate driver being arranged in the second well diffusion. Each of the first and second well diffusions and the high side negative supply voltage port of the gate driver are preferably electrically connected by suitable electrical wiring or traces.

The semiconductor substrate may comprise a P type or an N type epitaxial semiconductor substrate. The integrated high side gate driver structure may further comprise a third well diffusion comprising a second polarity semiconductor material arranged in the semiconductor substrate adjacent to the first well diffusion. A second polarity semiconductor material is arranged inside the third well diffusion to form a second transistor body diffusion and a transistor, e.g. a MOSFET such as a LDMOSFET, is arranged in the second transistor body diffusion. This embodiment is particularly well-adapted for integrating the above-discussed floating voltage regulator in the integrated high side gate driver structure. The transistor arranged in the second transistor body diffusion may be the previously discussed pass-transistor of the linear voltage regulator. Electrical wiring may be added on top of the semiconductor substrate to electrically connecting a source terminal of the pass-transistor with the high side positive supply voltage port of the gate driver. The source terminal of the transistor may be connected to the regulated DC voltage output of the floating voltage regulator.

The gate driver preferably comprises at least one MOSFET arranged in the first or second vertical wall sections of the second well diffusion or arranged in the first transistor body diffusion. In one such embodiment, the transistor driver comprises a first MOSFET arranged in the first transistor body diffusion and a second MOSFET, of opposite polarity to the first MOSFET, arranged in the first or second vertical wall sections of the second well diffusion. The first and second MOSFETs may be of opposite polarity. Each of the least one MOSFET or each of the first and second MOSFETs may be a low voltage device having a drain-source break-down voltage of less than 10 V. For the latter reason, the DC voltage difference between the high side positive and negative supply voltage ports of the gate driver supplied by the high side floating voltage regulator is preferably set to a value between 3 V and 10 V such as about 5 V. The first and second MOSFETs may be interconnected to form an inverter type of transistor driver. In this embodiment, the first and second MOSFETs are connected in series between the high side positive and negative supply voltage ports of the gate driver; and respective drain terminals of the first and second MOSFETs are connected to the driver output. The gate terminals of the first and second MOSFETs are preferably coupled together to form the control terminal of the transistor driver. Respective phases of a pulse width or pulse density modulated input signal, for example comprising an audio signal, may be applied to the control terminals of the transistor drivers and thereby modulate the output signal of the class D amplifier, AC motor driver etc.

A second aspect of the invention relates to an integrated semiconductor substrate in which the regulated high side gate driver circuit has a particularly compact layout with minimal semiconductor die area consumption. According to this second aspect of the invention the regulated high side gate driver circuit comprises the previously discussed metal-insulator-metal (MIM) capacitor according to any of the above described embodiments thereof. Furthermore, integrated circuit components of the gate driver and integrated circuit components of the floating voltage regulator, except for the regulation capacitor, are integrated in a first set of layers of the semiconductor substrate. The metal-insulator-metal (MIM) capacitor is integrated in a second set of layers of the semiconductor substrate arranged above the first set of layers such that the metal-insulator-metal (MIM) capacitor at least partly overlays or covers the integrated circuit components of the gate driver and the floating voltage regulator. Depending on the capacitance of the MIM capacitor, it may fully cover the integrated circuit components of the gate driver and the floating voltage regulator. This embodiment provides a compact layout of the regulated high side gate driver circuit despite the provision of a relatively large capacitance such as up till 100 pF or 200 pF, of the regulation capacitor. This relatively large capacitance of the regulation capacitor provides improved ripple suppression on the DC reference voltage as discussed in further detail below with reference to the appended drawings.

A third aspect of the invention relates to a class D audio amplifier output stage comprising a plurality of stacked power transistors connected between a positive power supply rail and a negative power supply rail of the class D audio amplifier. The plurality of stacked power transistors comprises respective control terminals configured to switch each power transistor between a conducting state and a non-conducting state in accordance with a control voltage. The class D audio amplifier output stage additionally comprises a plurality of regulated high side gate driver circuit according on any of the above-described embodiments thereof wherein driver outputs of the plurality of regulated high side gate driver circuits are connected to the respective control terminals of the plurality of stacked power transistors. Source terminals of the plurality of stacked power transistors are connected to respective ones of the high side negative supply voltage ports of the regulated high side gate driver circuits.

According to one embodiment of the class D audio amplifier output stage, the plurality of stacked power transistors comprises a first leg comprising at least first and second cascaded power transistors connected between the positive power supply rail and a signal output of the output stage, and a second leg comprising at least third and fourth cascaded power transistors connected between the signal output and a negative power supply rail of the output stage. A variant of this embodiment comprises a so-called flying capacitor to charge intermediate nodes of the first and second legs to a predetermined intermediate supply voltage level—for example a level corresponding to one-half of the DC voltage difference between the positive and negative power supply rails. According to this embodiment, the class D audio amplifier output stage comprises a flying capacitor connected between a first intermediate output stage node arranged between the first and second cascaded power transistors and a second intermediate output stage node arranged between the third and fourth cascaded power transistors.

BRIEF DESCRIPTION OF THE DRAWINGS

Embodiments of the invention are described below in further detail in connection with the appended drawings in which.

DESCRIPTION OF PREFERRED EMBODIMENTS

Figure 1:
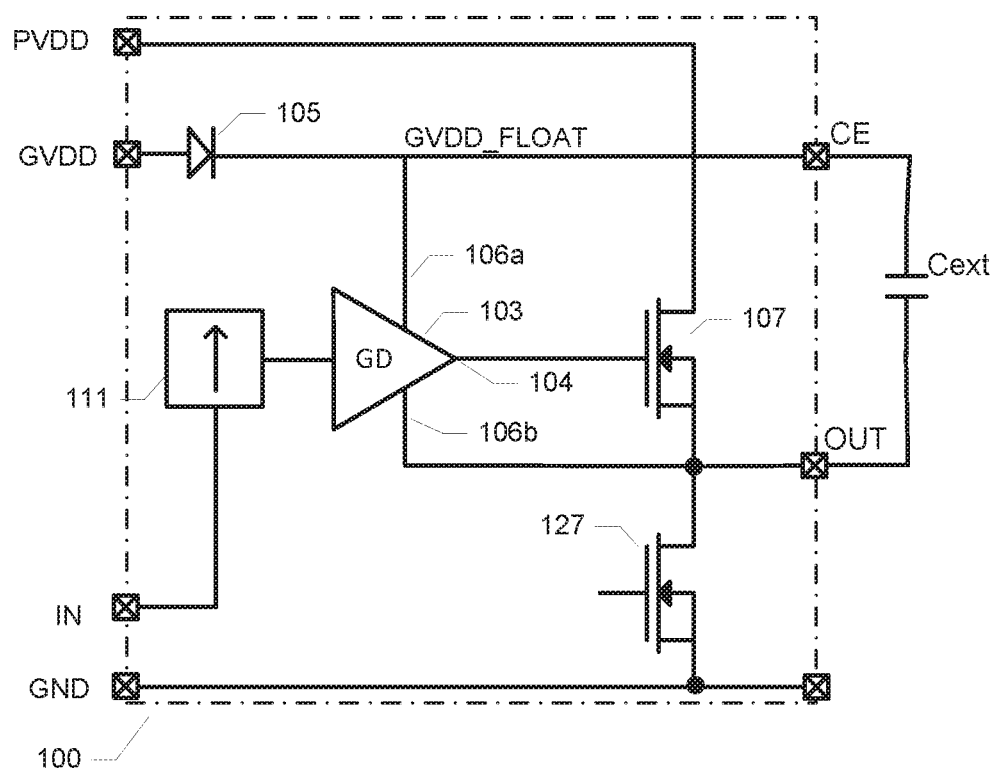
FIG. 1 is a simplified schematic circuit diagram of a class D amplifier output stage which comprises a prior art integrated high side gate driver structure, FIG. 2A) is a schematic circuit diagram of the class D amplifier output stage indicating connections to parasitic circuit capacitances and an external capacitance, FIG. 2B) is a simplified cross-sectional view of a prior art well structure in a semiconductor substrate for the prior art integrated high side gate driver structure, FIG. 3A) is a simplified schematic circuit diagram of a class D amplifier output stage which comprises a regulated high side gate driver circuit in accordance with a first embodiment of the invention, FIG. 3B) is a simplified cross-sectional view of a well structure formed in a semiconductor substrate for holding a gate driver portion of a regulated high side gate driver circuit accordance with the first embodiment of the invention, FIG. 4A) is a simplified schematic circuit diagram of a class D audio amplifier output stage connected to the regulated high side gate driver circuit in accordance with the first embodiment thereof, FIG. 4B) is a simplified cross-sectional semiconductor substrate layout view of the regulated high side gate driver circuit depicted on FIG. 4A)

FIG. 1 is a simplified schematic circuit diagram of a class D amplifier output stage 100. The class D amplifier output stage 100 comprises a prior art integrated high side gate driver structure or circuit, GD, 103. The integrated high side gate driver or circuit 103 has a driver output 104 electrically coupled or connected to a gate terminal of an NMOS power transistor 107 on a high side of the class D output stage. The source terminal of the NMOS power transistor 107 is coupled to a load node or terminal OUT which is connectable to a loudspeaker load for production of sound. The drain terminal of the NMOS power transistor 107 is coupled to a positive DC voltage supply or rail PVDD of the class D output stage. The class D output stage further comprises a low side NMOS power transistor 127 which has a drain terminal coupled to the load terminal OUT such that the loudspeaker load is driven in a push-pull fashion by alternatingly connecting the loudspeaker to the positive DC voltage supply PVDD and the negative DC voltage supply GND. The integrated high side gate driver circuit 103 is typically required to drive a large capacitive load presented by the gate of the NMOS power transistor 107. Furthermore, the gate driver circuit 103 is capable of driving the gate voltage of the NMOS power transistor 107 to a voltage level well-above the positive DC voltage supply PVDD to accommodate the threshold voltage of the NMOS power transistor 107 and ensure the latter has a low resistance in the conducting state or on-state. This drive voltage capability has typically been accomplished by supplying a high DC voltage GVDD_FLOAT to the gate driver circuit 103 via a separate high DC supply voltage line which is capable of generating a DC voltage of sufficiently high level due to its connection to a high side DC voltage supply GVDD of the class D amplifier through a diode 105. The high side DC voltage supply GVDD may for example possess a DC voltage level which is between 5 and 15 Volts higher than the positive DC voltage supply PVDD. The high DC voltage GVDD_FLOAT is supplied to the gate driver circuit 103 via a high side positive supply voltage port 106a of the driver circuit 103. A negative power supply voltage of the gate driver circuit 103 is provided via a high side negative supply voltage port 106b. The negative power supply voltage of the gate driver circuit 103 is connected to the load terminal OUT such that the gate driver 103 and the DC voltage supply GVDD_FLOAT are both floating relative to ground GND of the class D output stage 100.

A pulse width modulated audio signal is supplied to a driver input of the gate driver circuit 103 via a level shifter 111. Hence, a level shifted replica of this pulse width modulated audio signal is supplied to the gate of the NMOS power transistor 107 via the driver output 104 of the gate driver circuit 103. The prior art gate driver circuit 103 is placed in a traditional well-structure of a semiconductor substrate into which the class D output stage 100 is integrated. This traditional well-structure has a parasitic well capacitance (not shown) coupled from the well structure to the semiconductor substrate. The traditional well-structure must furthermore be tied to the highest DC voltage potential of the prior art gate driver circuit 103 as explained below which has the undesired effect that the parasitic well capacitance becomes coupled to the high DC voltage GVDD_FLOAT at the high side positive supply voltage port 106a. The formation of the parasitic well capacitance creates numerous problems with the stability of the regulated DC voltage and makes the presence of a relatively large, and therefore, external regulator capacitor Cext mandatory to mitigate the harmful effects of the parasitic well capacitance as explained below in additional detail with reference to FIGS. 2A) and 2B).

FIG. 2A) shows a schematic circuit diagram of the prior art class D amplifier output stage 100 depicted on FIG. 1, but including additional circuit details such as connections to the above-discussed parasitic well capacitance 213 and a parasitic gate capacitance Cgate of the NMOS power transistor 107. The gate driver circuit 103 may comprise a CMOS inverter comprising a PMOS-NMOS transistor pair schematically depicted as a pull-up and a pull down resistance 201a, 203a in series with respective ideal switches 201, 203. The high DC voltage supply (refer to FIG. 1) is schematically illustrated by GVDD and diode 205. The gate driver circuit alternatingly pulls the driver output 104 between the high DC voltage GVDD_FLOAT and the voltage at the load terminal OUT in accordance with the pulse width modulated audio signal leading to an alternating switching between on-states and off-states of the NMOS power transistor 107. However, the skilled person will understand that the capacitance of the gate terminal of the NMOS power transistor 107 may be very large for numerous types of class D power amplifiers for example larger than 1 nF, such as between 1 nF and 10 nF, depending on dimensions of the NMOS power transistor 107. As explained above, the traditional well-structure in which the prior art gate driver circuit 103 is placed leads to the formation of the previously discussed parasitic well capacitance 213 connected between the high DC voltage GVDD_FLOAT at node 206 and the ground potential of the semiconductor substrate in which the entire class D output stage 100 is formed or embedded. Consequently, the high voltage supply comprising GVDD and diode 205 needs to supply parasitic charging and discharging currents to the parasitic well capacitance 213 as indicated by parasitic well current INBL. Furthermore, a high slew-rate or dv/dt of the drain-source voltage of the NMOS power transistor 107 associated with the pulse width modulated waveform of drain-source voltage causes large parasitic charging and discharging currents to flow through the parasitic well capacitance 213. The large parasitic charging and discharging currents induce significant ripple voltage on the high DC voltage GVDD_FLOAT supplied by the high DC voltage supply. The slew-rate or dv/dt of the drain-source voltage of the NMOS power transistor 107 may for example be larger than 20 V/ns.

The ripple voltage induced on the high DC voltage can lead to numerous undesirable effects on the operation of the gate driver for example undervoltage events, loss of a gate driver state and control loss over the NMOS power transistor 107. To eliminate or at least suppress these unwanted effects, the external capacitor Cext is connected between the regulated DC voltage GVDD_FLOAT at node 206 and the output terminal OUT at node 212. The external capacitor Cext reduces the voltage ripple and stabilizes the regulated output voltage because the parasitic well current INBL can now be drawn from energy stored in Cext. In other words, the voltage ripple at the high DC voltage GVDD_FLOAT now becomes controlled by a capacitive voltage division between Cext and the parasitic well capacitance 213 such that a sufficiently large capacitance of Cext will suppress the voltage ripple to any desired degree. However, since the capacitance of the parasitic well capacitance 213 may be in the order of 5-10 pF, experience shows that typical Class D output stages need a capacitance in the order of 100 nF of the external capacitor Cext to adequately suppress the voltage ripple of the high DC voltage. This capacitance value makes it unfortunately impractical to integrate the external capacitor Cext on the semiconductor substrate together with the other electronic components because of prohibitive die area consumption. On the other hand, external components are highly undesirable in class D amplifier solutions for high-volume consumer oriented audio applications such as TV sets, mobile phones, MP3 players etc. where cost is an essential performance parameter. The external components add component and assembly costs to the class D amplifier solution. To further worsen the situation, a typical output stage of a Class D audio amplifier may include numerous power transistors and associated high side gate driver structures or circuits that each needs an external capacitor for example. H-bridge output stages of multi-level PWM amplifiers are one example. Consequently, it is highly desirable to provide a novel high side high side gate driver topology or structure for a power transistor that eliminates any need for an external capacitor to stabilize the regulated supply voltage to the high side positive supply voltage of the gate driver.

FIG. 2B) is a simplified cross-sectional view of an exemplary prior art well structure 220 arranged in a semiconductor substrate and used for holding the prior art integrated high side gate driver structure 100 discussed above in connection with FIG. 2A) above. The prior art well structure 220 leads to the formation of the above-discussed problematic coupling of the parasitic well capacitance 213 between the high DC voltage GVDD_FLOAT and ground (GND). The prior art well structure 220 is an N-well diffusion formed in a P type epitaxial semiconductor substrate 222. The P type epitaxial semiconductor substrate 222 is electrically connected to the ground (GND) potential of the class D output stage through a P+ diffusion contact 221 and suitable electrical wiring. The N-well diffusion comprises a horizontal N+ polarity buried layer (NBL) 226 which forms a bottom portion of the N-well diffusion. The N-well diffusion also comprises a vertical wall section 230 of N+ polarity semiconductor material electrically coupled to the NBL 226 via an intermediate BNW layer 228. The intermediate DNW layer 228 functions as an electrical interconnect layer between the NBL 226 and the NW 230.

The N-well diffusion is electrically connected to the high DC voltage GVDD_FLOAT through an N+ diffusion contact 232 and suitable electrical wiring. The coupling arrangement of the parasitic well capacitance 213 (NBL-epi Cap) to the P type epitaxial semiconductor substrate 222 is schematically illustrated by the capacitor symbol 213. The arrangement of the prior art integrated high side gate driver structure 100 inside the N-well diffusion (i.e. with volume 236) has the effect that the N-well diffusion must be electrically connected or tied to the highest electrical potential of the integrated high side gate driver structure 100. This is required because the PMOS-NMOS transistor pair or driver transistors of the gate driver circuit 103 are low-voltage devices, e.g. 3 V or 5 V devices, which cannot tolerate voltage levels much larger than the voltage level difference between the high DC voltage GVDD_FLOAT and the voltage level at OUT. The level of the high DC voltage, as measured relative to the DC voltage of the output node, OUT, may lie between 3 V and 6 V such as about 4.5 V. Consequently, the N-well diffusion is electrically connected to the high DC voltage GVDD_FLOAT. Hence, the parasitic well capacitance 213 is formed between the high DC voltage GVDD_FLOAT and ground (GND) leading to the above-discussed problems.

Figure 3A:
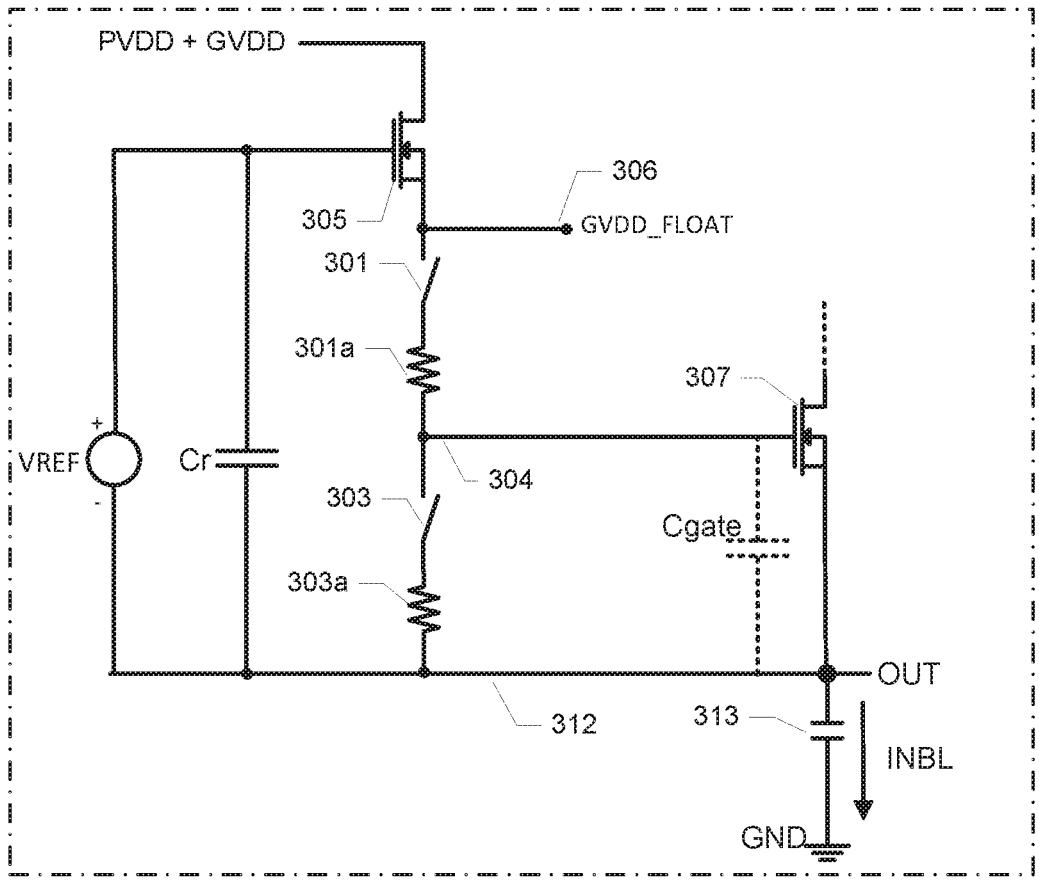

FIG. 3A) is a simplified schematic circuit diagram of a class D amplifier output stage 300 which comprises a regulated high side gate driver circuit in accordance with a first embodiment of the invention. The skilled person will understand that the present regulated high side gate driver circuit in the alternative may be used to drive an output or power transistor of a single-phase or multiphase motor driver or a power transistor of a switched mode supply. The regulated high side gate driver structure is placed within the novel type of well-structure depicted on FIG. 3B) which shows a simplified cross-sectional view of the novel well structure 324. As illustrated on FIG. 3A), in the novel type of well-structure 324, the parasitic well capacitance 313 associated with the N-well diffusions 326, 330 is connected to the output terminal OUT of the class D amplifier output stage instead of to the high DC voltage terminal GVDD_FLOAT as was the case in the prior art gate driver circuit illustrated on FIG. 2A). For this reason the parasitic well capacitance 313 is coupled between the output terminal OUT, at node 312, and ground (GND) of the class D output stage in the present regulated high side gate driver circuit. The output terminal OUT is a low impedance node of the class D output stage which node is driven by the source terminal of the LDNMOS power transistor 307.

When the LDNMOS power transistor 307 is placed in a conducting or on-state, it exhibits a low impedance and large current supply capability. Hence, the LDNMOS power transistor 307 can easily deliver the above-discussed parasitic well current INBL to charge and discharge the parasitic well capacitance 313. Consequently, undesired ripple voltage on the high DC voltage supply GVDD_FLOAT to the gate driver due to the previously discussed parasitic well current INBL has been eliminated. Therefore, the previously discussed external capacitor Cext that was required to reduce this voltage ripple on the high DC voltage of the prior art prior art regulated high side gate driver structure 100 has been eliminated. The high DC voltage supply GVDD_FLOAT (node 306) to the gate driver is generated by a floating linear voltage regulator 305 in the present embodiment of the gate driver as discussed in further detail below. The elimination of the external capacitor Cext leads to significant cost reduction and size reduction of the class D amplifier output stage and the corresponding class D audio amplifier solution. The skilled person will understand that other embodiments of the class D output stage may use a NMOS transistor, or PLDMOS transistor as the power transistor 307.

The regulated high side gate driver circuit may comprise a CMOS inverter comprising a PMOS-NMOS transistor pair schematically depicted as pull-up and pull down resistances 301a, 303a in series with respective ideal switches 301, 303. The regulated high side gate driver or circuit has a driver output 304 electrically coupled or connected to a gate terminal of a NMOS power transistor 307 on a high side of the class D output stage. The source terminal of the LDNMOS power transistor 307 is coupled to a load node or terminal OUT which is connectable to a loudspeaker load for sound reproduction. The drain terminal of the LDNMOS power transistor 307 may be coupled to a positive DC voltage supply or rail PVDD of the class D output stage or to a stacked power transistor. The class D output stage may further comprises a low side NMOS power transistor (not shown) as discussed in connection with the prior art class D output stage of FIG. 1 such that the loudspeaker load is driven in a push-pull fashion by alternatingly connecting the loudspeaker to a positive DC voltage supply and a negative DC voltage supply, e.g. GND. The regulated high side gate driver circuit must be capable of driving a large capacitive load presented by the gate of the LDNMOS power transistor 307 as discussed above. Furthermore, the gate driver is capable of accurately driving the gate voltage of the LDNMOS power transistor 307 to a voltage level well-above the positive DC supply rail (not shown) of the class D output stage to accommodate the threshold voltage of the LDNMOS power transistor 307. This will ensure a low on-resistance of the LDMOS power transistor 307.

The accurate setting of the gate voltage of the LDNMOS power transistor 307 is accomplished by supplying the regulated DC voltage GVDD_FLOAT to the gate driver 311 via the floating (relative to a ground node or ground potential, GND, of the class D output stage) linear voltage regulator 305. The linear voltage regulator is capable of generating a sufficiently high voltage level of the regulated DC voltage GVDD_FLOAT due to its connection to a high side DC voltage supply PVDD+GVDD of the class D amplifier. The high side DC voltage supply PVDD+GVDD is preferably a substantially fixed DC supply voltage which preferably is referred to the ground node or ground potential, GND of the class D output stage, i.e. the high side DC voltage supply is a ground referenced or non-floating DC voltage. In contrast, the regulated DC voltage GVDD_FLOAT is referred to a voltage potential at a negative regulator input 312. This voltage potential is a high side negative supply voltage port of the floating linear voltage regulator 305.

The floating linear voltage regulator 305 is schematically illustrated as comprising a linear regulating device in form of a LDMOS pass transistor 305 and a DC reference voltage generator VREF. The DC reference voltage generator VREF is connected between the negative regulator input 312 which also constitutes an audio output OUT of the class D output stage. The DC reference voltage generator VREF sets a predetermined DC reference voltage at a gate terminal, i.e. control terminal, of the LDMOS pass transistor 305 to set a suitable regulated and floating DC voltage GVDD_FLOAT at the regulator output node 306. A suitable smoothing or regulation capacitor Cr may be connected across VREF. The smoothing or regulation capacitor Cr may comprise a metal-insulator-metal (MIM) capacitor as discussed in further detail below. The floating linear voltage regulator 305 seeks to maintain a substantially constant DC voltage difference between the regulated DC voltage output GVDD_FLOAT and the negative regulator input 312. The level of the regulated DC voltage output GVDD_FLOAT with reference to the negative regulator input 312 may lie between 3 V and 6 V such as about 4.5 V for the same reasons as those discussed above in connection with the prior art embodiment of the high side gate driver circuit. The high side DC voltage supply PVDD+GVDD of the class D amplifier output stage forms the positive regulator input of the floating linear voltage regulator 305 and may for example possess a DC voltage level which is between 5 and 15 Volts higher than the positive DC supply rail of the class D output stage. The regulated DC voltage GVDD_FLOAT generated by the floating linear voltage regulator 305 is preferably supplied to the gate driver via the high side positive supply voltage port (not shown) of the gate driver. The skilled person will therefore appreciate that both the positive and negative regulator inputs of the floating linear voltage regulator 305 are floating relative to the ground GND potential of the class D output stage 300 as discussed above.

The skilled person will appreciate that a pulse width modulated audio signal may be supplied to a driver input (refer to item 414 of FIG. 4A)) of the gate driver via a suitable level shifter in a manner similar to the one illustrated on FIG. 1. Hence, a level shifted replica of this pulse width modulated audio signal is supplied to the gate of the NMOS power transistor 307 via the driver output 304 of the gate driver. The movement of the parasitic well capacitance 313 of the regulated high side gate driver structure from the regulated DC supply voltage to the output terminal OUT of the class D output stage is explained below with reference to FIGS. 3B), 4A) and 4B).

Figure 3B:
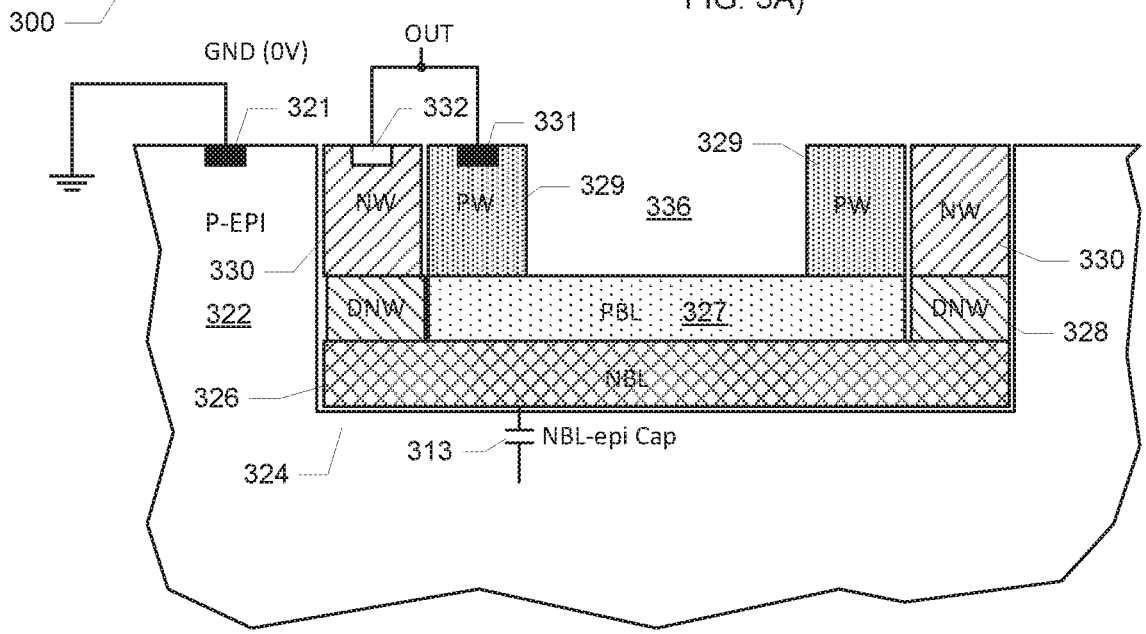
Figure 4A:
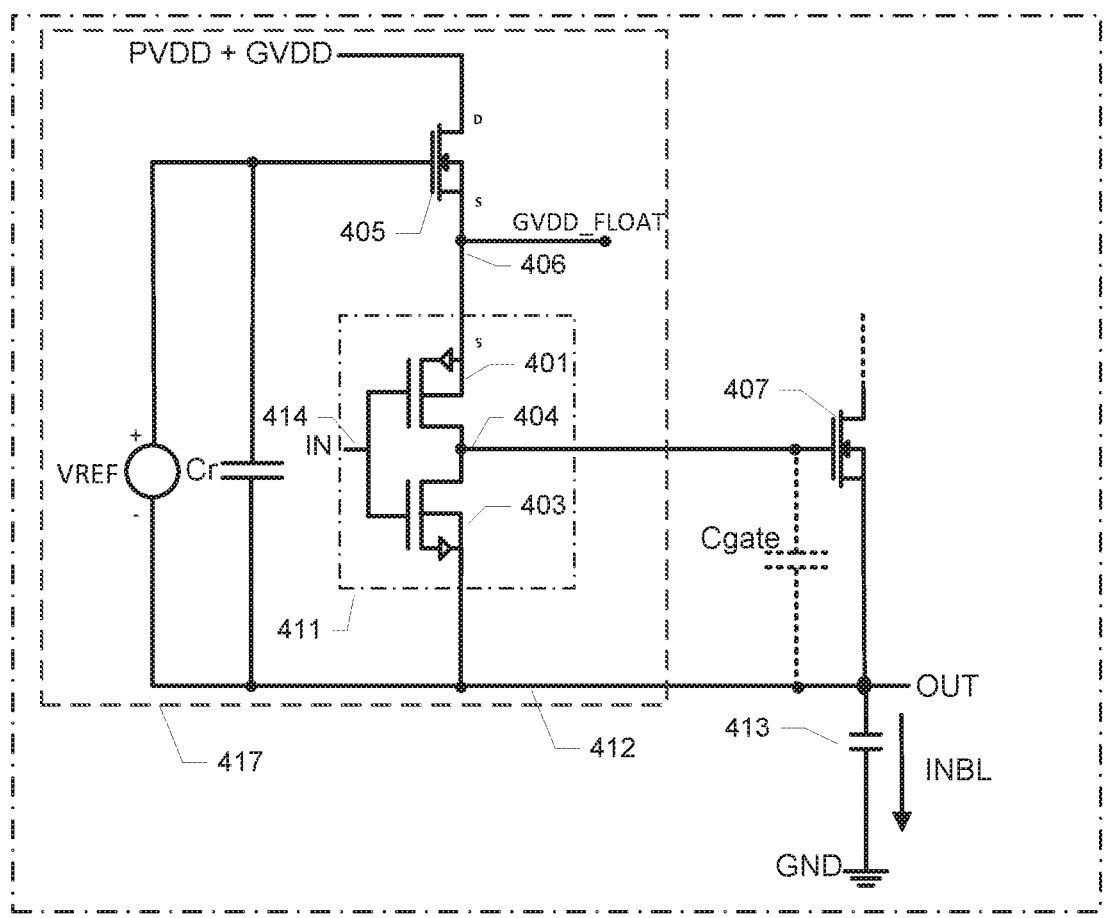

FIG. 3B) shows a semiconductor layout of the novel well structure 324 before formation of the gate driver circuitry. The novel well structure 324 is formed in a P+ type epitaxial semiconductor substrate 322. The P+ type epitaxial semiconductor substrate 322 is electrically connected to the ground (GND) potential of the class D output stage through a P+ diffusion contact 321 and suitable electrical wiring. The novel well structure 324 comprises a double junction isolation mechanism and structure with an extra P+ type buried layer 327 for the regulated high side gate driver structure. The novel well structure 324 comprises an N-well diffusion which comprises a horizontal N+ polarity buried layer (NBL) 326 and a vertical wall section 330 of N+ polarity semiconductor material. The vertical wall section 330 is electrically coupled to the NBL 326 via an intermediate DNW layer 328 to form a complete N-well structure. The NBL 326 forms a bottom portion of the novel well-structure 324 which hence has a peripheral outer wall abutted to, or facing, the P type epitaxial semiconductor substrate 322. The N-well diffusion is electrically connected to the output terminal OUT 312 through an N+ diffusion contact 332 and suitable electrical wiring. A second well diffusion comprising P+ polarity semiconductor material is arranged inside the N-well diffusion (326, 330, DNW) such that an outer peripheral wall of the second well diffusion is abutted to, or facing, an inner peripheral wall of the N-well diffusion. The second, or P-well, diffusion comprises a buried layer 327 which forms a horizontal bottom wall section of P-well diffusion. The P-well diffusion also comprises a vertical wall section 329 of P+ polarity semiconductor material which has a lowermost edge surface abutted and electrically connected to the horizontal bottom wall section 327. The P-well diffusion is electrically connected to the output terminal OUT 312 through a P+ diffusion contact 331 and suitable electrical wiring such that the P-well diffusion and the N-well diffusion are placed at the same electrical potential.

Figure 4B:
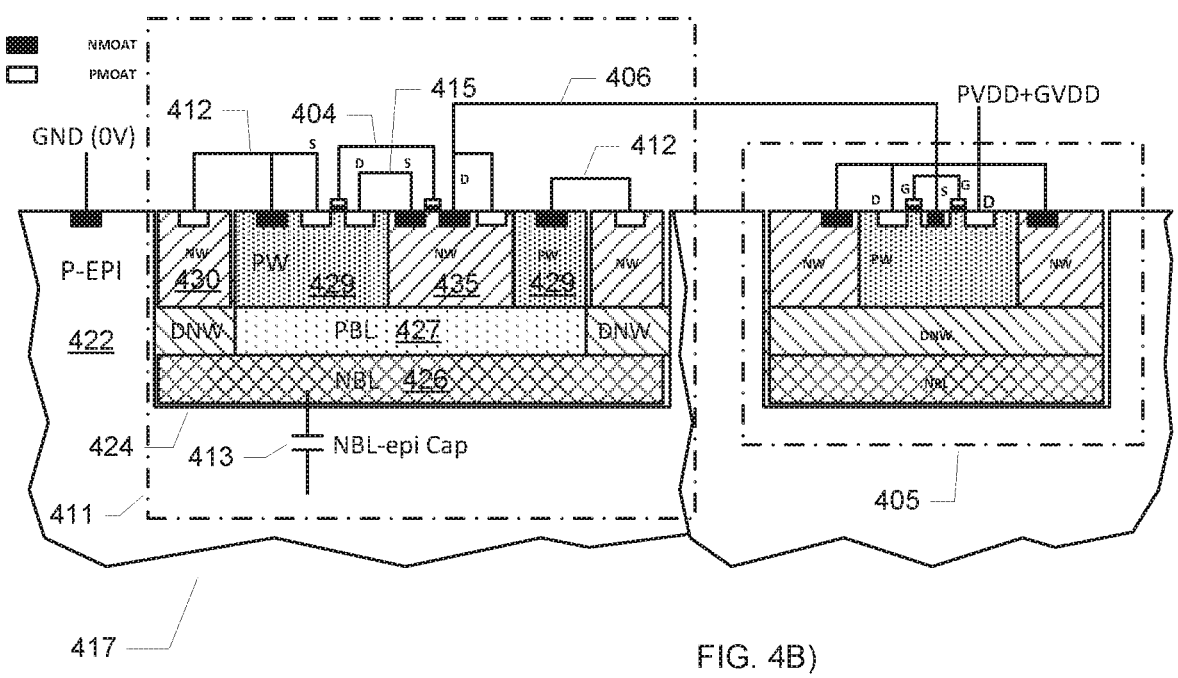

As shown on FIG. 4B), the regulated high side gate driver circuit 417 comprises a gate driver 411 arranged inside or in the novel well structure 424. FIG. 4B) shows a simplified cross-sectional view of the class D amplifier output stage 400 depicted on FIG. 4A) except for LDNMOS power transistor 407 embedded in the P+ type epitaxial semiconductor substrate 422. The class D amplifier output stage 400 comprises an open-loop topology floating linear voltage regulator 417 comprising LDNMOS pass transistor 405. The LDNMOS pass transistor 405 is controlled by a DC reference voltage VREF connected to the gate terminal to set a suitable regulated DC voltage at node 406, GVDD_FLOAT, for the high side positive supply voltage port (source terminal of PMOS transistor 401) of the gate driver 411. The source terminal of the LDNMOS pass transistor 405 is provides the regulated DC voltage output GVDD_FLOAT while the drain terminal is connected to the positive regulator input which in turn is connected to the high side DC voltage supply PVDD+GVDD. This source follower configuration of the LDNMOS pass transistor 405 provides rapid transient response at the regulated DC voltage output. The rapid transient response is highly beneficial to provide good load regulation under demanding load conditions with extremely steep rising and falling PWM or PDM waveform edges at the low impedance output terminal OUT 412 at the source terminal of the LDNMOS power transistor 407. The high side DC voltage supply PVDD+GVDD is preferably a substantially fixed DC supply voltage which preferably is referred to the ground node or ground potential, GND of the class D output stage, i.e. the high side DC voltage supply is a ground referenced or non-floating DC voltage.

The semiconductor layout of the LDMOS pass transistor 405 in the semiconductor substrate 422 is illustrated in cross-sectional view on the rightmost portion of FIG. 4B). A source terminal of the LDNMOS pass transistor 405 is coupled to the high side positive supply voltage port of the gate driver 411 to provide an accurate and stable regulated DC voltage supply GVDD_FLOAT for the gate driver 411. One of the drain terminals of the pass transistor 405 of the floating voltage regulator is coupled to the high side DC voltage supply PVDD+GVDD of the class D audio amplifier. The novel well structure 424 which encloses, or houses, the gate driver 411 has a similar construction to the previously discussed well-structure 324 and corresponding features have been provided with corresponding reference numerals to ease comparison. The gate driver 411 of the regulated high side gate driver circuit 417 comprises a PMOS-NMOS transistor pair 401, 403 with a driver output 404 electrically coupled or connected to a gate terminal of the LDNMOS power transistor 407 arranged on a high side of the class D output stage. Drain, gate and source diffusions or terminals of the NMOS transistor 403 of the gate driver are arranged in a vertical wall section 429 of P+ polarity semiconductor material as illustrated on FIG. 4B. This vertical wall section 429 is a part of an inner P-well of the novel well structure 424. The novel well structure 424 additionally comprises an N+ polarity transistor body diffusion 435 arranged in abutment to the opposing wall segments of the vertical wall section 429 and above the horizontal P+ buried layer 427. Drain, gate and source diffusions or terminals of the PMOS transistor 401 of the gate driver 411 are arranged in the N+ polarity transistor body diffusion 435 as illustrated on FIG. 4B). The gate terminals of the PMOS-NMOS transistor pair 401, 403 are electrically connected via a wire or trace 404 to form an input 414 of the gate driver.

The PMOS source terminal and the NMOS drain terminal of transistor pair 401, 403 are electrically connected via a wire or trace 415 to form the output of the gate driver 411 which output is connected to the gate of power LDNMOS transistor 407 of the class D output stage. The electrical wire or trace 412 establishes an electrical connection between the source of the NMOS transistor 403, the inner P-well and the outer N-well of the novel well structure 424. The coupling of the parasitic well capacitance 413 (NBL-epi Cap) to the P type epitaxial semiconductor substrate 422 is schematically illustrated by the capacitor symbol 413 on FIG. 4A) and FIG. 4B) which illustrate how the parasitic well capacitance 413 has been eliminated at the regulated DC voltage output 406, GVDD_FLOAT, and instead connected to the low impedance output terminal OUT 412 of the class D output stage leading to the previously discussed benefits.

Figure 5:
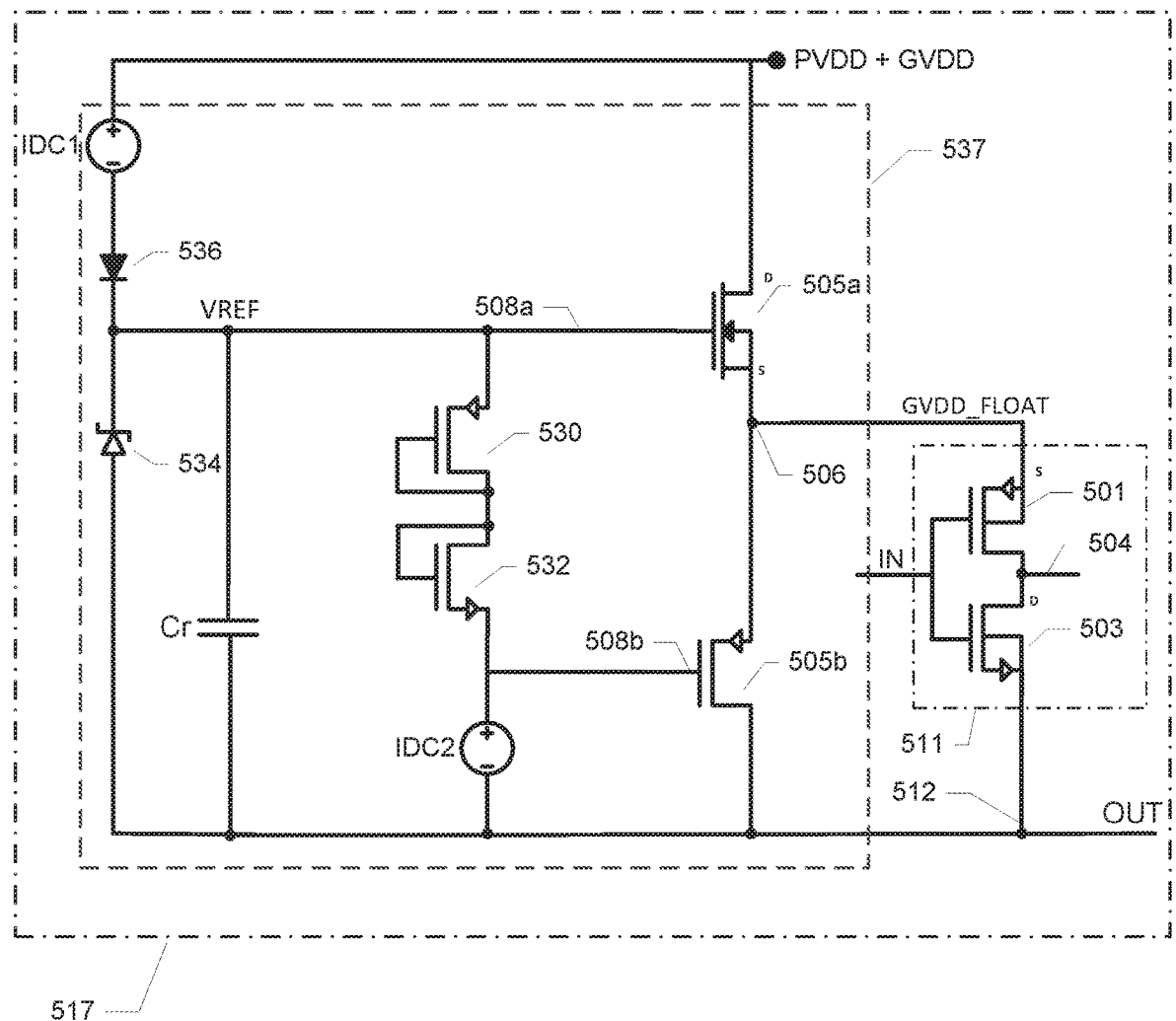
FIG. 5 shows a schematic circuit diagram of a regulated high side gate driver circuit in accordance with a second embodiment of the invention.

FIG. 5 shows a schematic circuit diagram of a second embodiment of the regulated high side gate driver assembly or circuit 517. The present embodiment comprises an open loop topology floating voltage regulator 537 with a linear regulating device comprising a class AB output stage. Compared to the floating voltage regulator design discussed above, the present class AB output stage has the advantageous capability of both sourcing current out of, and sinking current into, the regulated DC voltage output GVDD_FLOAT. This feature may lead to a more effective suppression of high-frequency ac ripple and/or noise on the regulated DC voltage output GVDD_FLOAT 506.

The present regulated high side gate driver circuit 517 comprises the open-loop floating voltage regulator 537 coupled to a high side positive supply voltage port GVDD_FLOAT of an inverter configured gate driver 511. A high side negative supply voltage port 512 of the gate driver 511 is coupled to a negative regulator input of the floating voltage regulator 537 as illustrated. This negative regulator input is also coupled to the Class AB output stage and a DC voltage reference generator of the floating voltage regulator 537. The DC reference voltage generator comprises a Zener diode 534 and a first constant current source IDC1 connected between the cathode of the Zener diode and the high side DC voltage supply PVDD+GVDD via a reverse voltage protection diode 536. As discussed above, the high side DC voltage supply PVDD+GVDD is preferably a substantially fixed DC supply voltage which preferably is referred to the ground node or ground potential of a circuit into which the regulated high side gate driver circuit 517 is integrated such as a class D audio amplifier output stage.

An anode of the Zener diode 534 is connected to the negative regulator input 512. The first constant current source IDC1 supplies a predetermined bias current in the reverse direction of the Zener diode 534 such that reasonable stable Zener knee voltage is developed across the Zener diode 534 and the Zener voltage is used as a DC reference voltage VREF for the floating regulator. The DC reference voltage VREF is applied to an input terminal 508a of the class AB output stage. The class AB output stage comprises a first output transistor 505a connected between the positive regulator input (at node PVDD+GVDD) and the regulated DC voltage output 506 and a second output transistor 505b connected between the regulated DC voltage output 506 and the negative regulator input 512. The cascade connection of diode connected MOS transistors 530, 532 and a second constant current source IDC2 forms a DC bias voltage circuit for the first and second output transistors 505a, 505b to set a suitable DC bias current therein. The DC bias voltage circuit is connected between respective gage or control terminals of the first and second output transistors 505a, 505b. The regulated DC output voltage at the regulated DC voltage output 506 will be approximately one gate-source voltage drop $V_{GS}$ of the first transistor 505a lower than the DC reference voltage VREF.

The floating voltage regulator 537 preferably comprises a smoothing or regulation capacitor Cr which is connected across VREF. In one embodiment of the regulated high side gate driver circuit 517, the regulation capacitor Cr comprises a metal-insulator-metal (MIM) capacitor which is arranged above the residual passive and active semiconductor components of the high side gate driver circuit 517 on the semiconductor substrate. Since the capacitance, and thereby dimensions, of the regulation capacitor Cr should be relatively large to provide optimal ripple suppression, it is important to minimize die area consumption by Cr. This may advantageously be achieved by placing Cr in a set of layers of the semiconductor substrate arranged on top of another set layers which holds the residual active and passive integrated circuit components of the regulated high side gate driver circuit 517. The metal-insulator-metal (MIM) capacitor may for example partly or fully cover the residual active and passive integrated circuit components of the regulated high side gate driver circuit 517. The capacitance of Cr may lie between 1 pF and 100 pF.

The role of the regulation capacitor Cr in the floating voltage regulator 537 comprises suppressing noise and ripple on the DC reference voltage generator and acting as a fast responding current/energy reservoir for the class AB output stage allowing the regulated DC voltage output 506 to provide adequate supply current to the gate driver 511. The fast response of the regulated DC voltage output 506 is important to adequately suppress high frequency ripple or spike voltages thereon imparted by the previously discussed fast transient current pulses drawn by the gate driver 511 during operation of the class D audio amplifier. As mentioned above, the input signal at the input IN of the gate driver 511 may comprise a pulse width modulated (PWM) or pulse density modulated (PDM) audio signal with extremely fast rising and falling waveform edges such as rise and fall times around 1 ns. These rapid pulses will impart correspondingly rapid current/voltage pulses on the regulated DC voltage at the regulator output 506. This challenge makes it important to provide a fast transient response to load changes at the regulated DC voltage output 506 to provide adequate regulation of the regulated DC voltage output 506 and thereby suppress ac ripple or voltage spikes therein. The fast response time of the floating voltage regulator 537 is facilitated by the open-loop configuration or topology of the regulator. The skilled person will appreciate that the present floating voltage regulator 537 is without a current or voltage regulation feedback loop from the regulated DC voltage output 506 back to a control terminal of the class AB output stage forming the linear regulating element of the voltage regulator. The present inventors have experimentally verified that such a current or voltage regulation feedback loop feedback loop generally reacts too slow to adequately suppress the nanosecond duration current impulses imparted on the regulated DC voltage output 506 by the switching activity of the gate driver 511.

Figure 6:
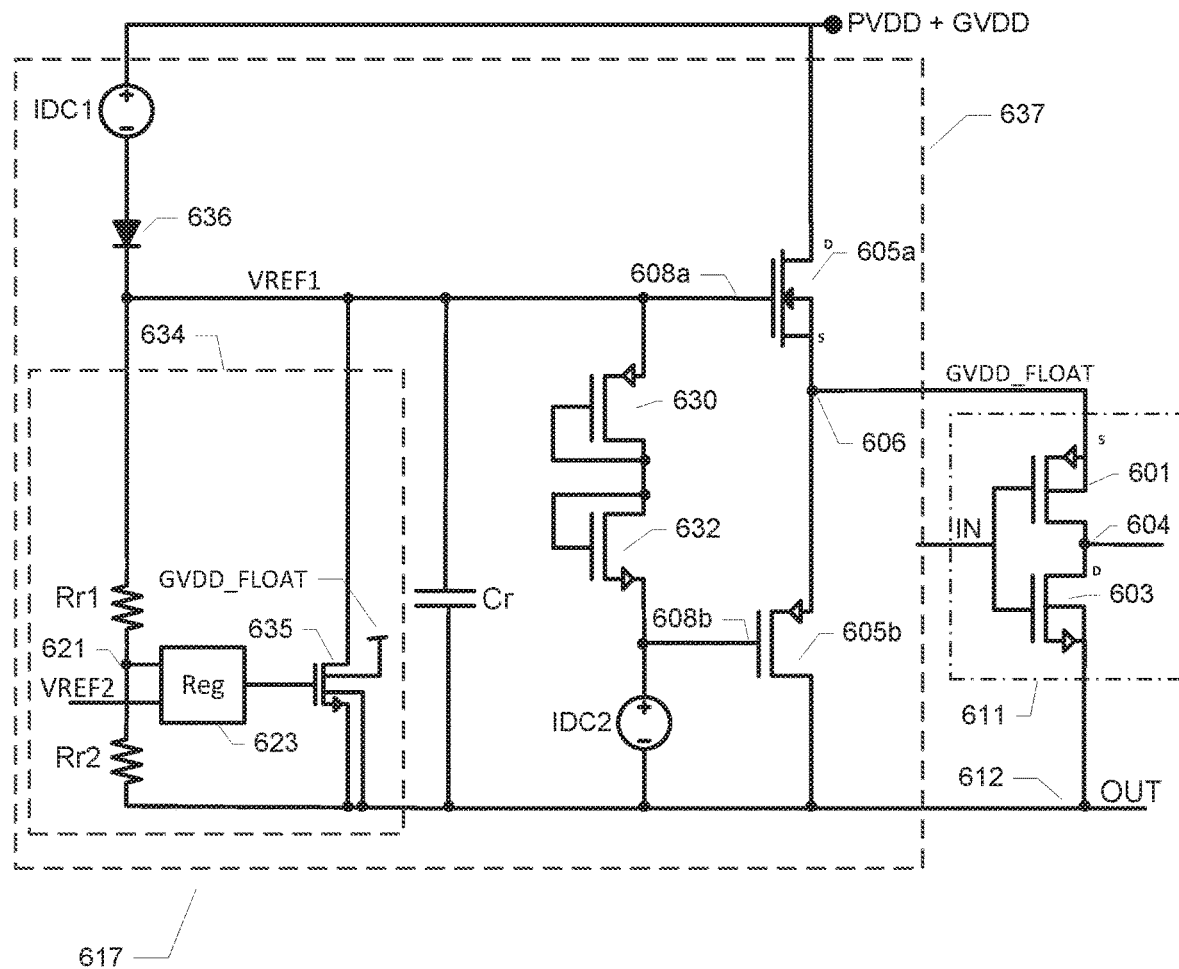
FIG. 6 shows a schematic circuit diagram of a regulated high side gate driver circuit in accordance with a third embodiment of the invention.

FIG. 6 shows a schematic circuit diagram of a third embodiment of a regulated high side gate driver circuit 617. The skilled person will understand that the present regulated high side gate driver circuit 617 may be arranged in the previously discussed novel well structure of the semiconductor substrate or arranged in a standard LDMOS semiconductor substrate. The present high side gate driver circuit 617 comprises a floating voltage regulator 637 based on a shunt regulation circuit 634. The skilled person will understand that the shunt regulation circuit 634 may largely replace the Zener diode 534 of the second embodiment as a voltage reference generating element.

The skilled person will understand that the class AB output stage, comprising first and second output transistors 605a, 605b, and the DC bias voltage circuit, comprising IDC2 and transistors 630, 632, may have the same functionality and electrical characteristics as those of the corresponding circuit components of the second embodiment of the high side gate driver circuit 517.

The shunt regulation circuit 634 comprises a shunt transistor 635 and the regulated DC voltage is controlled by a variable current sinking through the shunt transistor 635. The floating voltage regulator 637 comprises a linear pass transistor 605 acting as a regulating device which is connected between the high side DC voltage supply PVDD+GVDD and the regulated DC voltage output GVDD_FLOAT 606. The linear pass transistor 605 is controlled by an output VREF1 of the shunt regulation circuit 634 connected to a gate terminal of the linear pass transistor. The shunt regulation circuit 634 further comprises an error amplifier 623 having an output coupled to the gate or control terminal of the shunt transistor 635. A first input of the error amplifier 623 is connected to a voltage divider comprising resistors R1r and Rr2. A first end of the voltage divider is connected to VREF1 while the second end is connected to the negative regulator input at node 612 of the shunt voltage regulator 637. A tapping point or node 621 in-between Rs1 and Rs2 provides a shunt voltage to the first input of the error amplifier 623 proportional to the VREF1 voltage. The second input of the error amplifier 623 is connected to a DC reference voltage VREF2 which may be generated by, or derived from, a suitable temperature stable voltage reference such as a bandgap voltage reference. The error amplifier 623 reacts to changes of the regulated DC voltage by either increasing or decreasing the control or gate voltage of the shunt transistor 635 to counteract the change of the VREF1 voltage and thereby seeking to maintain or stabilize the to the regulated DC voltage output GVDD_FLOAT at a desired or target DC voltage. The shunt regulation circuit 634 comprises a feedback loop from VREF1 voltage back to the gate of the shunt transistor 635. The regulated DC voltage is sensed through the voltage divider and the error amplifier 623. The feedback loop configuration does not introduce any noticeable time delay in the response of the shunt regulator circuit since the loop only extends from the drain terminal to the gate terminal of the shunt transistor 635. The error amplifier 623 may comprise a differential amplifier for example an operational amplifier where the first input of the error amplifier 623 is a non-inverting input of the operational amplifier and the second input is an inverting input of the operational amplifier, or vice versa. The shunt transistor 635 may comprise various types of transistors such as a BJT or MOSFET. In a preferred embodiment of the floating voltage regulator 637, the shunt transistor 635 comprises a drain extended NMOS (DE-NMOS) transistor. In this embodiment, the DE-NMOS transistor comprises a first drain terminal connected to the VREF1 voltage and a second or extended drain terminal connected to the regulated DC voltage output GVDD_FLOAT.

As mentioned above, the present high side gate driver circuit 617 does not comprise the previously discussed Zener diode 534 of the second embodiment of the invention to set the DC reference voltage VREF1. The omission of the Zener diode is advantageous because this feature avoids that the negative buried layer (NBL) of the cathode of the Zener diode is brought in contact with the semiconductor substrate and thereby opens a potential noise injection path to the DC reference voltage VREF1. Furthermore, the negative buried layer (NBL) of the cathode of the Zener diode forms an undesired parasitic capacitance to the semiconductor substrate. The role and properties of the regulation capacitor Cr may the same as the previously discussed properties in connection with the description of the regulation capacitor Cr of the second embodiment of the regulated high side gate driver circuit 517.

Figure 7:
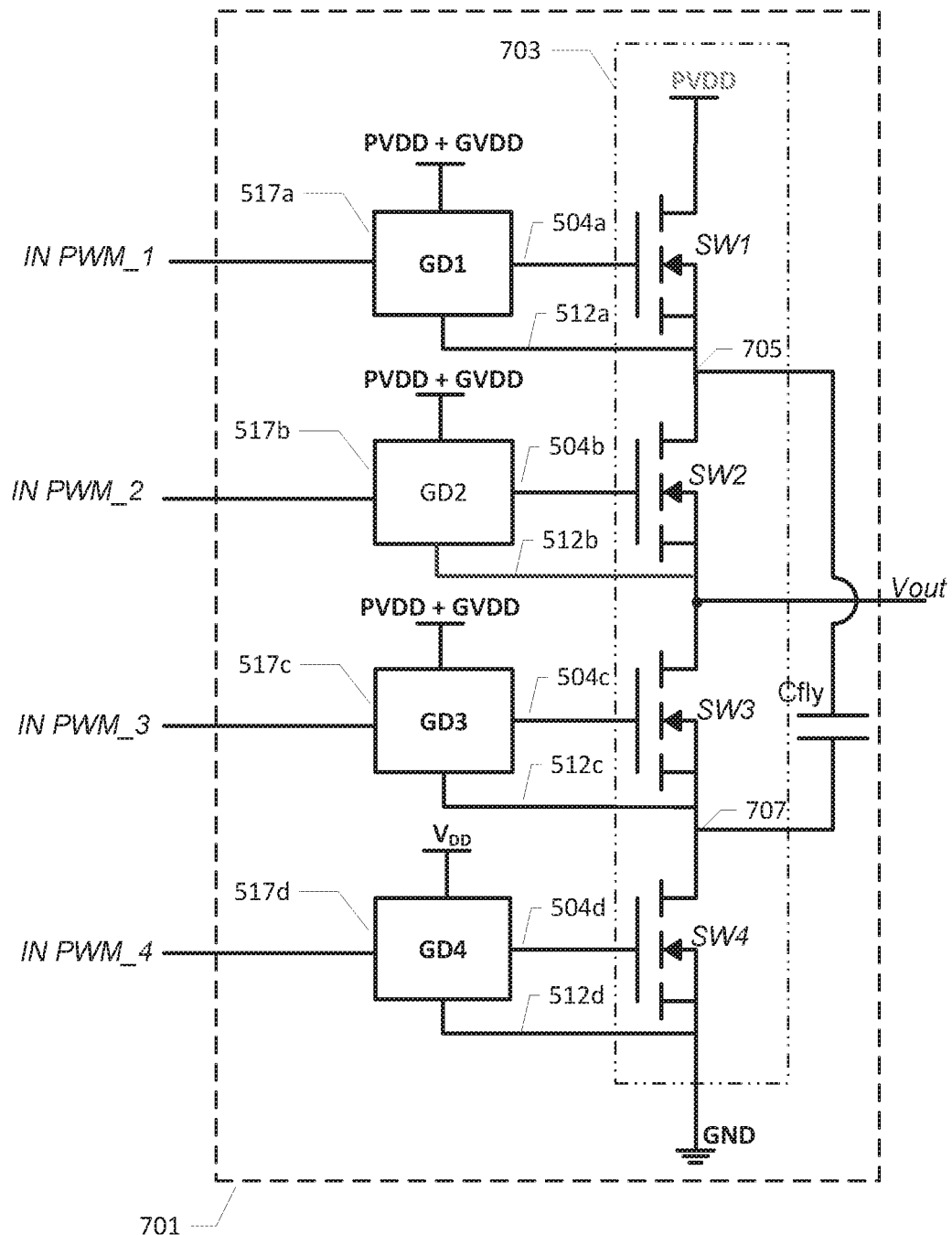
FIG. 7 shows a schematic circuit diagram of a multi-level class D audio amplifier output stage driven by respective regulated high side gate driver circuits in accordance with another aspect of the invention.

FIG. 7 shows a schematic circuit diagram of a class D amplifier circuit 701 which comprises a multi-level class D audio amplifier output stage 703 driven by respective regulated high side gate driver circuits 517a, 517b, 517c, 517d.

Each of the regulated high side gate driver circuits 517a, 517b, 517c, and 517d may comprise a regulated high side gate driver circuit in accordance with one of the previously discussed embodiments thereof. The multi-level class D audio amplifier output stage or output stage 703 comprises a four stacked power transistors SW1, SW2, SW3, SW4 connected in cascade between a positive power supply rail PVDD and a negative power supply rail, in form of ground potential GND in the present embodiment, of the class D amplifier circuit 701. The gate terminals of the four stacked power transistors SW1, SW2, SW3, SW4 are connected to respective floating and regulated DC voltage outputs 504a, 504b, 504c, 504d of the high side gate driver circuits 517a, 517b, 517c, 517d such that each power transistor is switched between conducting and non-conducting states in accordance with the gate voltage of the power transistor in question. A source terminal of each of the four stacked power transistors SW1, SW2, SW3, and SW4 is connected to the negative regulator input of the particular regulated high side gate driver circuit driving the gate terminal of the same power transistor. The skilled person will appreciate that the lower regulated high side gate driver circuit 517d may be connected to a lower supply rail voltage than the positive power supply rail PVDD because the source terminal of the associated power transistor SW4 is permanently connected to GND. Hence, the regulated DC voltage output 504d of the high side gate driver circuit 517d may in fact be a ground referenced voltage rather than a floating voltage. The multi-level class D audio amplifier output stage 703 comprises a first leg which comprises the first and second cascaded power transistors SW1, SW2 connected between the positive power supply rail PVDD and a signal output VOUT of the output stage. The multi-level class D audio amplifier output stage 703 further comprises a second leg which comprises the third and fourth cascaded power transistors SW3, SW4 connected in cascade between the signal output Vout and the negative power supply rail GND. A flying capacitor Cfly is connected between a first intermediate output stage node 705 arranged between the first and second cascaded power transistors and a second intermediate output stage node 707 arranged between the third and fourth cascaded power transistors. The flying capacitor is preferably charged to one-half of the voltage difference between the positive and negative power supply rails PVDD and GND to set a mid-point voltage at the signal output Vout.

The invention claimed is:

1. A regulated high side gate driver circuit for power transistors, comprising:
   a gate driver comprising a high side positive supply voltage port and a high side negative supply voltage port; and
   a floating voltage regulator comprising:
      a positive regulator input, connectable to a high side DC voltage supply;
      a regulated DC voltage output;
      a negative regulator input;
      a DC reference voltage generator configured to generate a DC reference voltage; and
      a regulation capacitor connected between positive and negative terminals of the DC reference voltage generator, and configured to suppress noise and ripple within the generated DC reference voltage,
   wherein the negative regulator input is connected to the high side negative supply voltage port and the regulated DC voltage output is connected to the high side positive supply voltage port of the gate driver.

2. The regulated high side gate driver circuit of claim 1, wherein the high side DC voltage supply has a voltage that is higher than a positive DC voltage rail coupled to a power transistor that is driven by the regulated high side gate driver circuit.

3. The regulated high side gate driver circuit of claim 1, wherein the floating voltage regulator comprises a linear regulating device connected to the regulated DC voltage output and configured to suppress noise and ripple voltage on the high side DC voltage supply in the regulated DC voltage output.

4. The regulated high side gate driver circuit of claim 3, wherein the floating voltage regulator comprises an open-loop topology without a voltage or current regulation feedback loop from the regulated DC voltage output back to a control terminal of the linear regulating device.

5. The regulated high side gate driver circuit of claim 4, wherein the linear regulating device comprises:
   a pass transistor connected between the positive regulator input and the regulated DC voltage output, wherein a control terminal of the pass transistor is connected to the DC reference voltage generated by the DC reference voltage generator.

6. The regulated high side gate driver circuit of claim 3, wherein the linear regulating device comprises:
   a pass transistor connected between the positive regulator input and the regulated DC voltage output, wherein a control terminal of the pass transistor is connected to the DC reference voltage generated by the DC reference voltage generator.

7. The regulated high side gate driver circuit of claim 6, wherein the pass transistor comprises a MOSFET or bipolar transistor with a source or emitter, respectively, connected to the regulated DC voltage output, and a drain or collector terminal, respectively, connected to the positive regulator input.

8. The regulated high side gate driver circuit of claim 6, wherein the linear regulating device comprises a class AB output stage having a positive power supply terminal connected to the positive regulator input and a negative power supply terminal connected to the negative regulator input; and
   wherein a control terminal of the class AB output stage is connected to the DC reference voltage and an output of the class AB output stage is coupled to the regulated DC voltage output to source current to, and sink current from, a load at the regulated DC voltage output.

9. The regulated high side gate driver circuit of claim 6, wherein the linear regulating device comprises a class AB output stage having a positive power supply terminal connected to the positive regulator input and a negative power supply terminal connected to the negative regulator input; and
   wherein a control terminal of the class AB output stage is connected to the DC reference voltage and an output of the class AB output stage is coupled to the regulated DC voltage output to source current to, and sink current from, a load at the regulated DC voltage output.

10. The regulated high side gate driver circuit of claim 3, wherein the linear regulating device comprises a class AB output stage having a positive power supply terminal connected to the positive regulator input and a negative power supply terminal connected to the negative regulator input; and
   wherein a control terminal of the class AB output stage is connected to the DC reference voltage and an output of the class AB output stage is coupled to the regulated DC voltage output to source current to, and sink current from, a load at the regulated DC voltage output.

11. The regulated high side gate driver circuit of claim 10, wherein the class AB output stage comprises:
a first output transistor connected between the positive regulator input and the regulated DC voltage output,
a second output transistor connected between the negative regulator input and the regulated DC voltage output; and
a bias voltage circuit connected between respective control terminals of the first and second output transistors to set a predetermined DC bias current therein.

12. The regulated high side gate driver circuit of claim 1, wherein the DC reference voltage generator comprises a reversely biased Zener diode.

13. The regulated high side gate driver circuit of claim 1, wherein the DC reference voltage generator comprises a shunt regulator circuit.

14. The regulated high side gate driver circuit of claim 13, wherein the shunt regulator circuit comprises:
a shunt transistor connected between the DC reference voltage and the negative regulator input,
an error amplifier comprising an output, a first input and a second input where the output is connected to a control terminal of the shunt transistor,
a voltage divider connected to the DC reference voltage and configured to supply a shunt voltage proportional to the DC reference voltage to the first input of the error amplifier,
a second DC voltage reference connected to the second input of the error amplifier.

15. The regulated high side gate driver circuit of claim 1, comprising:
a semiconductor substrate comprising a first polarity semiconductor material in which a first well diffusion is formed,
the first well diffusion comprising a second polarity semiconductor material and having a peripheral outer wall abutted to the semiconductor substrate,
a second well diffusion comprising first polarity semiconductor material arranged inside the first well diffusion such that an outer peripheral wall of the second well diffusion is abutted to an inner peripheral wall of the first well diffusion; and
the gate driver being arranged in the second well diffusion;
an electrical connection between each of the first and second well diffusions and the high side negative supply voltage port of the gate driver.

16. The regulated high side gate driver circuit of claim 1, wherein the regulation capacitor comprises a metal-insulator-metal (MIM) capacitor.

17. The regulated high side gate driver circuit of claim 16, wherein the MIM capacitor has a capacitance between 1 pF and 100 pF or between 10 pF and 50 pF.

18. The regulated high side gate driver circuit of claim 16, wherein the floating voltage regulator comprises a linear regulating device connected to the regulated DC voltage output and configured to suppress noise and ripple voltage on the high side DC voltage supply in the regulated DC voltage output, and wherein the MIM capacitor is integrated in a same semiconductor die as the linear regulating device and the DC reference voltage generator.

19. An integrated semiconductor substrate comprising:
the regulated high side gate driver circuit of claim 16,
wherein integrated circuit components of the gate driver and integrated circuit components of the floating voltage regulator, except for the regulation capacitor, are integrated in a first set of layers of the semiconductor substrate, and
wherein the MIM capacitor is integrated in a second set of layers of the semiconductor substrate arranged above the first set of layers such that the MIM capacitor at least partly overlays the integrated circuit components of the gate driver and the floating voltage regulator.

20. A class D audio amplifier output stage comprising: a plurality of stacked power transistors connected between a positive power supply rail and a negative power supply rail of the class D audio amplifier, the plurality of stacked power transistors comprising respective control terminals configured to switch each power transistor between a conducting state and a non-conducting state in accordance with a control voltage, a plurality of regulated high side gate driver circuits according to claim 16, wherein driver outputs of the plurality of regulated high side gate driver circuits are connected to the respective control terminals of the plurality of stacked power transistors; and wherein source terminals of the plurality of stacked power transistors are connected to respective ones of the high side negative supply voltage ports of the plurality of regulated high side gate driver circuits.

21. The class D audio amplifier output stage of claim 20, wherein the plurality of stacked power transistors comprises:
a first leg comprising at least first and second cascaded power transistors connected between the positive power supply rail and a signal output of the output stage, and
a second leg comprising at least third and fourth cascaded power transistors connected between the signal output and a negative power supply rail of the output stage.

* * * * *